US006330638B1

United States Patent
Ubowski

(10) Patent No.: US 6,330,638 B1
(45) Date of Patent: Dec. 11, 2001

(54) SYNCHRONOUS AUDIO DRAM STORING AUDIO AND CODE DATA

(75) Inventor: Richard M. Ubowski, Harleysville, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/316,922

(22) Filed: May 21, 1999

Related U.S. Application Data

(60) Provisional application No. 60/100,854, filed on Sep. 18, 1998.

(51) Int. Cl.[7] .............................. G06F 12/00; H04M 1/64
(52) U.S. Cl. ...................... 711/105; 379/67.1; 379/88.07
(58) Field of Search ................................. 711/105, 165, 711/102, 103; 379/67.1, 88.07

(56) References Cited

U.S. PATENT DOCUMENTS

| | | | |
|---|---|---|---|
| 5,600,821 | * | 2/1997 | Falik et al. ........................... 711/173 |
| 5,706,334 | * | 1/1998 | Balk et al. ............................. 379/67 |
| 5,937,424 | * | 8/1999 | Leak et al. ........................... 711/103 |
| 6,108,762 | * | 8/2000 | Law et al. ............................ 711/217 |

OTHER PUBLICATIONS

Cosoroaba, Adrian B., "SDRAM—High Performance Memory Devices Running CPU Bus Speeds", Proceedings of the IEEE Southeastcon '96, Apr. 1996, pp. 604–607.*

* cited by examiner

Primary Examiner—Reginald G. Bragdon
(74) Attorney, Agent, or Firm—Schnader Harrison Segal & Lewis, LLP

(57) ABSTRACT

In accordance with a preferred embodiment of the present invention, there is provided a data processing system having a digital processor core, a dynamic RAM, which is preferably a synchronous, audio-grade RAM (SARAM) for speech and code storage, and a separate read-only memory (ROM) for storage of operation code for the DSP core. The system may also use SARAM having one area configured for code space and data, and a second, separate area, which can be used to encode or store speech. The system may also use either a boot mask ROM or erasable programmable ROM.

8 Claims, 2 Drawing Sheets

SYNCHRONOUS AUDIO DRAM STORING AUDIO AND CODE DATA

This application claims the benefit of U.S. Provisional Application No. 60/100,854, filed on Sep. 18, 1998.

BACKGROUND OF THE INVENTION

1. Field of the Invention

The present invention relates to a data processing system incorporating dynamic random access memory, particularly to a data processing system incorporating synchronous dynamic random access memory, and more particularly to a data processing system utilizing a synchronous, audio-grade dynamic random access memory for speech and code storage.

2. Description of the Prior Art

In conventional data processing systems, the functionality of the digital signal processor (DSP) is limited by the amount of available high-speed memory. For example, most conventional high-speed DSP cores rely on a zero-wait state internal memory. However, in many cases the cost of this type of device is prohibitive.

Today's embedded DSP designs are based on integrated devices which have zero-wait state memory, with internal ROM (read-only memory) and RAM (random access memory). These zero-wait state memories are required to take advantage of the processing capabilities of these high speed DSPs.

However, in order to meet aggressive cost targets for these embedded DSP designs, the amount of internal memory is severely limited. Consequently, these memory limitations have a tremendous impact on product performance, since software must be optimized to operate with the limited memory available. The end result is fewer features. Memory hungry software algorithms must wait for the next generation IC processing technology to allow the integration of additional memory, while the processing power is already available today.

Moreover, software algorithm development for the embedded DSP designs relies on software development specialists who can create software using particular DSP assembly language. This results in a significant increase in the cost of manufacturing embedded DSPs and associated software.

While higher level language C-compilers are available for today's DSPs to allow software engineers who are not assembly code specialists to develop software for these embedded designs, these C-compilers are not efficient enough to create code which can reside in the limited internal memory of the embedded DSPs. Human intervention is, unfortunately, required.

Dynamically refreshable random access memory (DRAM) is one of a wide variety of integrated circuit memories now available for storing data. Currently, DRAM is often utilized for providing rapid data storage and retrieval in computerized equipment at a reasonable cost.

In response to the tremendous speed increase in the system clock frequency of newer microprocessors, the use of synchronously operated DRAM control circuitry has recently moved to the fore in the rapidly evolving field of DRAM technology. Synchronous DRAM (SDRAM) has several advantages over conventional DRAM and other memory architectures. It is more accurate, and has significantly reduced tendency to misfire from noise on associated control buses.

Additionally, SDRAM is capable of burst addressing and bank switching to achieve very high data transfer speeds. These high speeds are highly desirable for use with today's faster microprocessors, and is motivating the development of improved memory devices.

Synchronous audio-grade random access memory (SARAM) is a memory component which is often produced as a result of the DRAM manufacturing process. These devices, since they typically suffer from failing bits, are not suitable for most computer applications. However, these devices very often have blocks of perfectly good bits, which are suitable for a variety of applications, ranging from simple data storage to critical program storage.

SUMMARY OF THE INVENTION

It has been discovered that a significantly lower cost, higher performance data processing system can be achieved through the incorporation of SDRAM technology, and particularly SARAM technology into today's high speed DSPs.

Accordingly, the present invention provides a high performance data processing system having a low cost, high speed memory that allows a system designer to exploit the speed of the system's digital processor, while simultaneously having virtually unlimited space for operation code. This configuration allows a system designer to take full advantage of a digital processor's high-speed performance, while permitting rapid code development using a higher level language, such as a C-compiler, and further allows for easy software change via an external ROM.

In accordance with a preferred embodiment of the present invention, there is provided a data processing system having a digital processor core, a dynamic RAM, which is preferably a synchronous, audio-grade RAM (SARAM) for speech and code storage, and a separate read-only memory (ROM) for storage of operation code for the DSP core. The system may also use SARAM having one area configured for code space and data, and a second, separate area, which can be used to encode or store speech. The system may also use either a boot mask ROM or erasable programmable ROM. The invention may preferably comprise any devices used for speech recording, such as a telephone answering device, for example.

DETAILED DESCRIPTION

Figure 1:
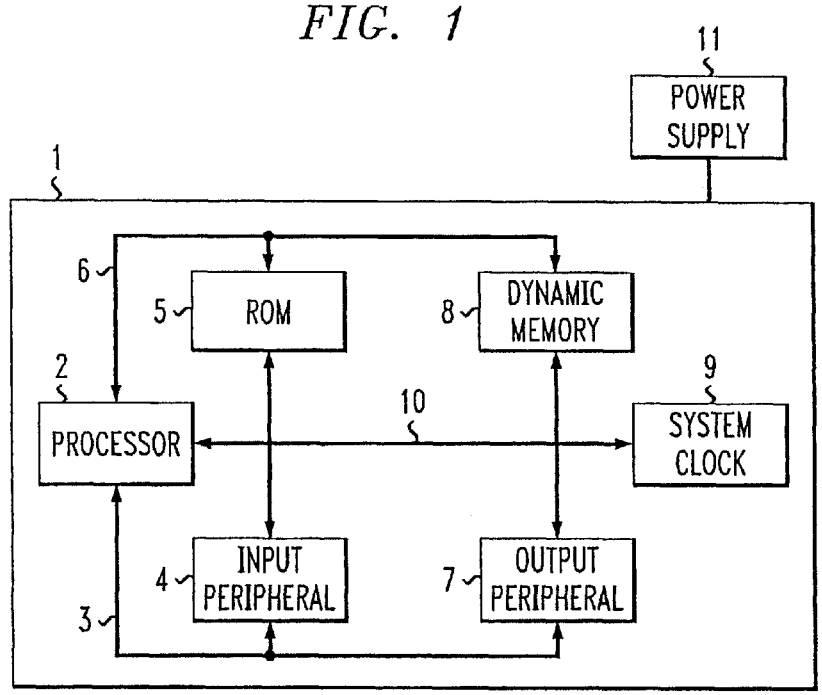
FIG. 1 is a block diagram illustrating the components and configuration of a preferred embodiment of the present invention.

The present invention will be understood more fully from the detailed description given below and from accompanying drawings of preferred embodiments of the invention, which, however, should not be taken to limit the invention to a specific embodiment, but are for explanation and understanding only.

Synchronous audio-grade random access memory (SARAM) is a memory component which is often produced as a result of the DRAM manufacturing process. These devices, since they typically suffer from failing bits, are not suitable for most computer applications. However, these devices very often have blocks of perfectly good bits which are suitable for a variety of applications, ranging from simple data storage to critical program storage.

In addition, the portions of the SARAM that contain failing bits can still be used to store encoded speech (i.e. speech digitally compressed to conserve memory space using algorithms designed to withstands errors, such as the speech coders used in many digital wireless applications). Thus, error detection and correction can be used to allow use of portions of the memory which have large numbers of failing bits.

As a result, it has been discovered that SARAM has special characteristics, which enable it to significantly increase the processing power of today's embedded DSP designs, while simultaneously lowering costs. These characteristics include the following.

SARAM devices are low cost and readily available, since memory manufacturers separate out these devices as a result of the DRAM manufacturing process. These devices have ample space for both program code storage and data storage. The amount of memory space available dwarfs today's embedded memories. SARAM devices are typically available today in 16 M densities and are rapidly moving to 64 M, while DRAM manufacturers are already releasing 128 M devices in sample quantities.

As an example, a high performance 100 MIPs (100 million instructions/second) DSP 1609 with 10 nanosecond memory access time, available from Lucent Technologies, contains 24K words of ROM and 2K words of RAM. In sharp contrast, a 166 MB SARAM with only one good 4 MB block provides 256K words of memory (where one word=16 bits). And, once again, bad blocks can be used for encoded speech storage applications.

Another significant advantage of SARAM is that simple C-compilers can be used for code development instead of complex DSP assembly code. New algorithms can be deployed quickly, as memory is no longer a limiting factor.

Moreover, SARAM device access times meet the requirements of today's high speed embedded DSP designs. DSP manufacturers can mass produce pure processors (with or without a small amount of cache memory on-chip) at lower costs than devices having integrated memories.

In an embedded DSP design, if a software bug is found, the device must be discarded, and a new device must be manufactured with its ROM modified with the software for the bug fix. In sharp contrast, by using the SARAM designed system of the present invention, the software bug can quickly and inexpensively be fixed, since the program code may be stored in an inexpensive external "boot" ROM or EPROM which can be quickly updated with the software patch.

Referring to FIG. 1, Data Processing System 1 according to a preferred embodiment of the present invention is shown. It includes Digital Processor 2, which communicates digital data by way of I/O Bus 3 to and from Input Peripheral Device 4. Input Peripheral Device 4 may comprise any number of input peripherals which are well known to those of ordinary skill in the art, including but not limited to keyboards, microphones, video devices, magnetic tape and disk drives, optical disk drives, etc.

In a preferred embodiment, Digital Processor 2 has no internal on-board ROM, that is, no ROM masked onto the processor core chip itself, but may or may not have some on-board RAM. Operation code for operating Digital Processor 2 is instead preferably stored separately in ROM 5, which communicates in a conventional manner with Digital Processor 2 through Control Bus 6. ROM 5 may comprise any combination of any number of components well known to those of skill in the art, including but not limited to, a discrete logic chip or integrated circuit as a boot mask ROM, an erasable programmable ROM (EPROM), or FLASH memory. These components may be configured, for example, on a printed circuit board, contained in a multi-chip integrated circuit module, or in a combination thereof Digital Processor 2 also sends processed data via I/O Bus 3 to Output Peripheral 7, where the outputted data may be used for its desired purpose, such as being displayed, read, or being used for controlling another device (not shown). Output Peripheral 7 may comprise any number of output devices well known to those of ordinary skill in the art, including but not limited to display screens, such as computer monitors, an audio system, a printer, intelligent photocopier, etc. Output Peripheral 7, may also, of course, be a storage device, such as those noted in regard to Input Peripheral Device 4 above.

Control signals and data are also transmitted between Digital Processor 2 and DRAM 8 by way of Control Bus 6. DRAM 8 is preferably synchronous DRAM, or more preferably SARAM, to incorporate the significant advantages previously noted to achieve a higher performance, lower cost DSP.

The transfer of data and control signals among each of the components is timed in a conventional manner by System Clock 9. System Clock 9 may be integrated with Digital Processor 2, or may comprise a separate component, which transmits its signals in a conventional manner via Timing Bus 10. System Clock 9 itself may comprise any number of components well known to those of ordinary skill in the art, such as an integrated circuit or discrete logic chip employing a frequency oscillator such as a crystal oscillator.

Power is supplied to the entire system through Power Supply 11 in a conventional manner. Data Processing System 1 may be fabricated in a number of ways well known to those of skill in the art, such as in a large scale integrated circuit incorporating each of the components described above, or as a printed circuit board having individual integrated circuit components attached thereon, and interconnected via imprinted circuit buses, or through the use of multi-chip integrated circuit modules contained on a circuit board or bus, and the like. Power Supply 11 may comprise a number of well known systems, including ATX, AT and other power supply standards in the case of a printed circuit board.

On power-up of the Data Processing System 1, Digital Processor 2 retrieves operation code from ROM 5 and stores it in DRAM 8 or in its on-board RAM, or in a combination of both. During operation, Digital Processor 2 accesses the DRAM 8 for writing data into or reading data from the individual storage cells of DRAM 8. Control signals are transmitted between Digital Processor 2 and DRAM 8 by way of the Control Bus 6, as noted above.

Since DRAM 8 is preferably synchronous audio-grade DRAM (SARAM), it may also be configured for speech and code storage. SARAM includes a memory array of dynamic storage cells, which is similar to the well-known arrays of electromagnetically assignable cells used in DRAM devices. In a particularly preferred embodiment of the invention, the SARAM may be configured to have a special "golden" area having memory reserved for code and data storage, and a second area that can be used to encode and store speech data from Input Peripheral Device 4. Thus, speech data can be maintained even if up to 50% of the memory cells in the SARAM are bad.

Good blocks in the SARAM are preferably previously identified for code storage. Manufacturers may screen an SARAM according to pre-determined specifications. For example, they may require that the first 6 MB must be error free. This system can use a boot ROM in addition to EPROM, EEPROM, or FLASH memory.

The DSP is preferably programmed so that the first time the system is powered up, it checks the SARAM memory and creates a map of the good and bad areas. This memory map may then be stored in a writeable, nonvolatile EPROM, EEPROM, or FLASH memory.

The program code for achieving this may be stored in the boot ROM, FLASH memory, or EPROM. On power up, the DSP reads this program code and stores it in the designated portion of the SARAM. The DSP then performs a reset and begins code execution from the SARAM.

Figure 2:
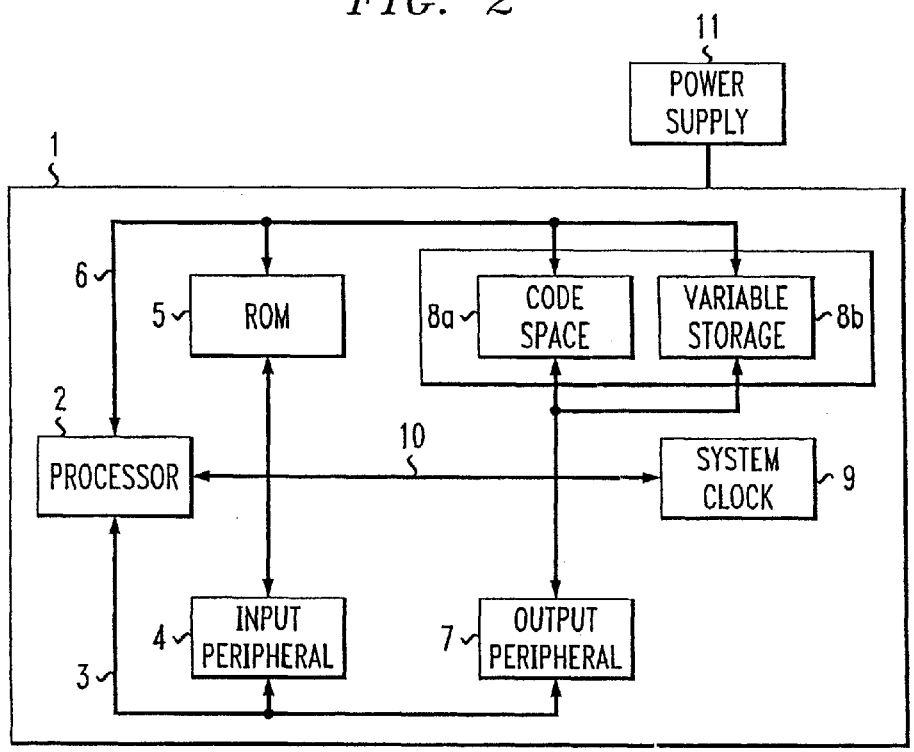
FIG. 2 is a block diagram illustrating the components and configuration of a second preferred embodiment of the present invention.

In another preferred embodiment of the system of the present invention, the system architecture can consist of one SARAM for code space 8a and a second SARAM for variable storage 8b to allow a system with simultaneous instruction and data access. An example of this embodiment is illustrated in FIG. 2, wherein like numbers have been used to identify components which also appear in FIG. 1.

If a separate boot mask ROM or EPROM is utilized in the preferred embodiment of the invention described above, significant advantages are achieved over conventional systems in that it allows a system designer to use a higher level language, such as a C-compiler, for the coding of the Digital Processor 2, instead of complex assembly code. This results in a low cost system, which can potentially yield a 100 MIPs operating performance. Moreover, the system of the present invention eliminates the need for digital processor software masks.

Figure 3:
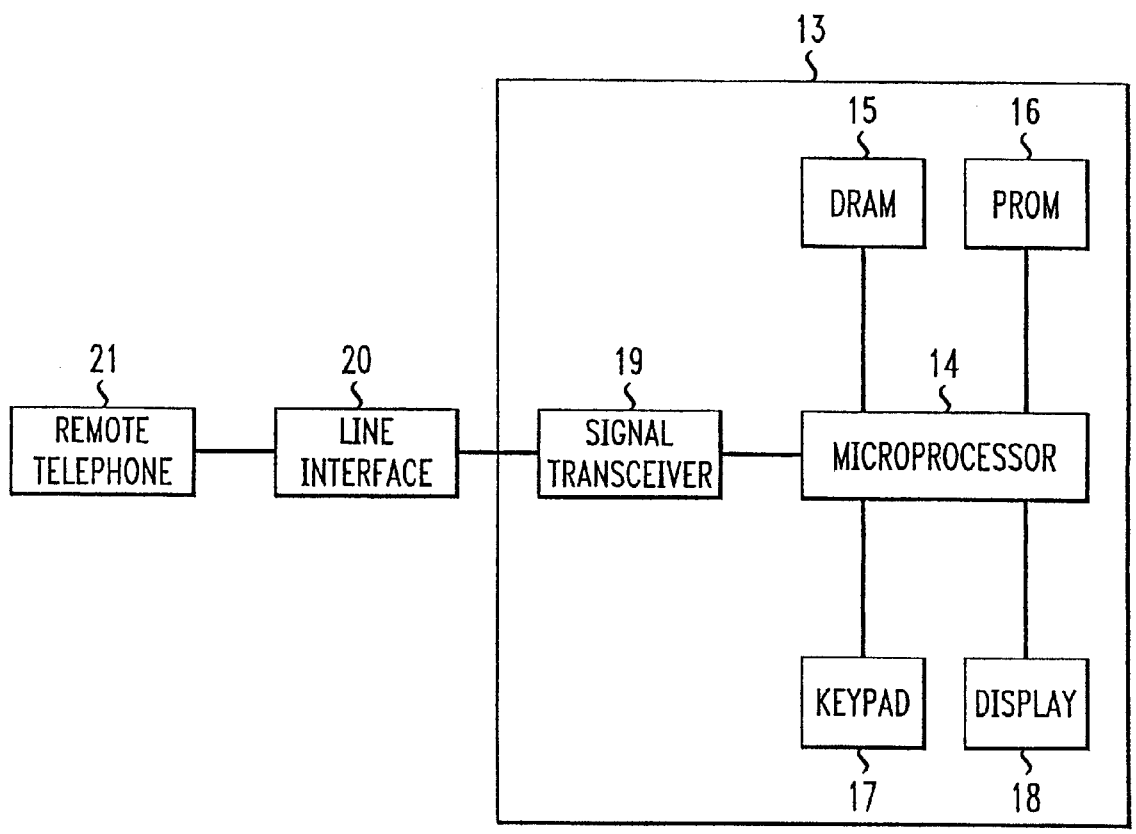
FIG. 3 is a block diagram illustrating a preferred embodiment of the invention incorporating a telephone answering device.

The system of the present invention may preferably be incorporated into a device used for speech recordation, such as a telephone answering device. This preferred embodiment of the present invention is illustrated in FIG. 3. As shown in FIG. 3, Telephone Answering Device 13 includes Microprocessor 14, DRAM 15, and PROM 16, connected via a control bus, which may be split to control both DRAM 15 and PROM 16. Input/output devices, Keypad 17 and Display 18, can be used to input information to Microprocessor 14 and view information sent therefrom to operate and control Telephone Answering Device 13. This may be accomplished through the use of a conventional I/O bus.

Audio signals are transmitted and received in a conventional manner by Microprocessor 14 through Signal Transceiver 19. Signal Transceiver 19, may comprise, for example, a simple electronic receiver and digital processing circuitry, FM transceiver for cordless operation, a private branch exchange, and the like. Audio signals are inputted to Telephone Answering Device 13 from Remote Telephone 21 through Line Interface 20 in a conventional manner. These audio signals may be stored in appropriate portions of DRAM 15 in accordance with aspects of the present invention as previously described.

Although the present invention has been described in its preferred embodiments with reference to the accompanying drawing, it can be readily understood that the present invention is not restricted to the preferred embodiments and that various changes and modifications can be made by those skilled in the art without departing from the spirit and scope of the present invention. For example, the system can be modified to increase the number of synchronous DRAMs as necessary to accommodate the associated system.

What is claimed is:

1. A digital processing system comprising:

a digital signal processing core;

a separate memory, said separate memory containing program code for operating said digital signal processing core; and a synchronous audio grade random access memory (SARAM) in communication with said digital signal processing core, wherein said SARAM contains one memory area for storing said program code to operate said digital signal processing core and for storing data generated by said digital signal processing core, and a separate area to encode or store speech.

2. The system of claim 1, wherein said digital signal processing core also contains an internal read-only memory.

3. The system of claim 1, wherein said digital signal processing core also contains internal random access memory.

4. The system of claim 1 wherein said separate memory comprises one or more memories selected from the group consisting of read-only memory (ROM), erasable programmable read-only memory (EPROM), and FLASH memory.

5. A telephone answering system comprising:

a transceiver for receiving audio signals into said telephone answering system and transmitting audio signals therefrom;

a digital signal processing core for processing said audio signals;

a separate memory, said separate memory containing program code for operating said digital signal processing core; and an SARAM in communication with said digital signal processing core, said SARAM containing one memory area for storing said program code and for storing data generated by said digital signal processing core, and a separate area to encode for or store speech.

6. The system of claim 5, wherein said digital signal processing core also contains an internal read-only memory.

7. The system of claim 5, wherein said digital signal processing core also contains internal random access memory.

8. The system of claim 5, wherein said separate memory comprises one or more memories selected from the group consisting of read-only memory (ROM), erasable programmable read-only memory (EPROM), and FLASH memory.

* * * * *